(12) United States Patent
Kang et al.

(10) Patent No.: US 8,203,662 B2
(45) Date of Patent: Jun. 19, 2012

(54) VERTICAL CHANNEL THIN-FILM TRANSISTOR AND METHOD OF MANUFACTURING THE SAME

(75) Inventors: Hoon Kang, Suwon-si (KR); Yun-Seok Lee, Cheonan-si (KR); Jae-Sung Kim, Yongin-si (KR); Yang-Ho Jung, Yongin-si (KR); Young-Je Cho, Cheonan-si (KR); Cheon-Jae Maeng, Suwon-si (KR); Woo-Geun Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 329 days.

(21) Appl. No.: 12/571,345

(22) Filed: Sep. 30, 2009

(65) Prior Publication Data

US 2010/0133539 A1    Jun. 3, 2010

(30) Foreign Application Priority Data

Dec. 3, 2008    (KR) .................. 10-2008-0122039

(51) Int. Cl.
| | |
|---|---|
| G02F 1/136 | (2006.01) |
| H01L 29/04 | (2006.01) |
| H01L 29/10 | (2006.01) |
| H01L 31/00 | (2006.01) |
| H01L 27/14 | (2006.01) |
| H01L 29/15 | (2006.01) |
| H01L 31/036 | (2006.01) |

(52) U.S. Cl. ................ 349/43; 257/60; 257/72

(58) Field of Classification Search .......... 349/47, 349/46, 43; 257/60, 135, 242, 263, 302, 257/59, 72; 438/156, 137–138
See application file for complete search history.

(56) References Cited

U.S. PATENT DOCUMENTS

| | | | |
|---|---|---|---|
| 2002/0093614 A1* | 7/2002 | Moon et al. .................. 349/141 |
| 2006/0125025 A1* | 6/2006 | Kawashima et al. ......... 257/401 |
| 2006/0175609 A1* | 8/2006 | Chan et al. ..................... 257/59 |
| 2007/0200110 A1* | 8/2007 | Jain ................................ 257/58 |
| 2008/0277721 A1* | 11/2008 | Lo et al. ....................... 257/329 |

\* cited by examiner

*Primary Examiner* — Mark Robinson
*Assistant Examiner* — Dennis Y Kim
(74) *Attorney, Agent, or Firm* — Innovation Counsel LLP

(57) ABSTRACT

Provided is a thin-film transistor (TFT) substrate. The TFT substrate includes: an insulating substrate; a semiconductor pattern which is formed on the insulating substrate, the semiconductor pattern having a top surface and a bottom surface; a source electrode and a drain electrode which are disposed on the top and bottom surfaces of the semiconductor pattern, respectively; a gate electrode which is disposed alongside the semiconductor pattern with a gate insulating film interposed therebetween; a data line which is connected to the source electrode and extends in a first direction; a gate line which is connected to the gate electrode and extends in a second direction; and a pixel electrode which is connected to the drain electrode and is formed in a pixel region.

26 Claims, 6 Drawing Sheets

VERTICAL CHANNEL THIN-FILM TRANSISTOR AND METHOD OF MANUFACTURING THE SAME This application claims priority from Korean Patent Application No. 10-2008-0122039 filed on Dec. 3, 2008 in the Korean Intellectual Property Office, the disclosure of which is incorporated herein by reference in its entirety.

BACKGROUND OF THE INVENTION

1. Field of the Invention

The present invention relates to a thin-film transistor (TFT) substrate and a method of manufacturing the same, and more particularly, to a TFT substrate which includes TFTs having shorter channels and thus can be used in high-speed and ultra-high density & precision products and a method of manufacturing the TFT substrate.

2. Description of the Related Art

Liquid crystal displays (LCDs) are one of the most widely used types of flat panel displays (FPDs). Generally, an LCD includes a pair of substrates having electrodes and a liquid crystal layer interposed between the two substrates. In an LCD, voltages are applied to electrodes to generate an electric field. Accordingly, the alignment of liquid crystal molecules of a liquid crystal layer is determined, and polarization of incident light is controlled. As a result, a desired image is displayed on the LCD.

Of various types of LCDs, LCDs widely now used have electric field generating electrodes formed on each of two substrates. In particular, a plurality of pixel electrodes are arranged in a matrix form on one (a thin-film transistor (TFT) substrate) of the substrates, and a common electrode covers the entire surface of the other one (a common electrode substrate) of the substrates. To display an image on these LCDs, a separate voltage must be applied to each pixel electrode. Thus, TFTs, each being a three-terminal device for switching a voltage that is to be applied to each pixel electrode, are connected to the pixel electrodes, respectively, and gate lines and data lines are formed on one of the substrates. Here, the gate lines deliver signals for controlling the TFTs, and the data lines deliver voltages that are to be applied to the pixel electrodes.

In the case of high-speed and high density & precision LCDs, each pixel must be charged to a desired voltage level during a short horizontal period (1H). To this end, ON current of each TFT needs to be improved. The ON current of each TFT can be improved by increasing a ratio (W/L) of a width (W) of a channel region to a length (L) thereof. In theory, the width (W) of the channel region can be increased unlimitedly. However, a wider channel region increases the size of each TFT, thereby reducing an aperture ratio and increasing parasitic capacitance. Consequently, screen display quality is significantly reduced. Meanwhile, the length (L) of the channel region can no longer be reduced due to limitations of exposure facilities.

SUMMARY OF THE INVENTION

Aspects of the present invention provide a thin-film transistor (TFT) substrate which includes TFTs having shorter channels and thus can be used in high-speed and ultra-high density & precision products.

Aspects of the present invention also provide a method of manufacturing the above TFT substrate.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a TFT substrate including: an insulating substrate; a semiconductor pattern formed on the insulating substrate, the semiconductor pattern having a top surface and a bottom surface; a source electrode and a drain electrode disposed on the top and bottom surfaces of the semiconductor pattern, respectively; a gate electrode disposed alongside the semiconductor pattern with a gate insulating film interposed therebetween; a data line which is connected to the source electrode and extends in a first direction; a gate line which is connected to the gate electrode and extends in a second direction; and a pixel electrode which is connected to the drain electrode and is formed in a pixel region.

According to another aspect of the present invention, there is provided a method of manufacturing a TFT substrate. The method includes: forming a semiconductor pattern on an insulating substrate and forming a source electrode and a drain electrode on top and bottom surfaces of the semiconductor pattern, respectively; and forming a gate electrode alongside the semiconductor pattern with a gate insulating film interposed therebetween, wherein a data line is connected to the source electrode and extends in a first direction, a gate line is connected to the gate electrode and extends in a second direction, and a pixel electrode is connected to the drain electrode and is formed in a pixel region.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
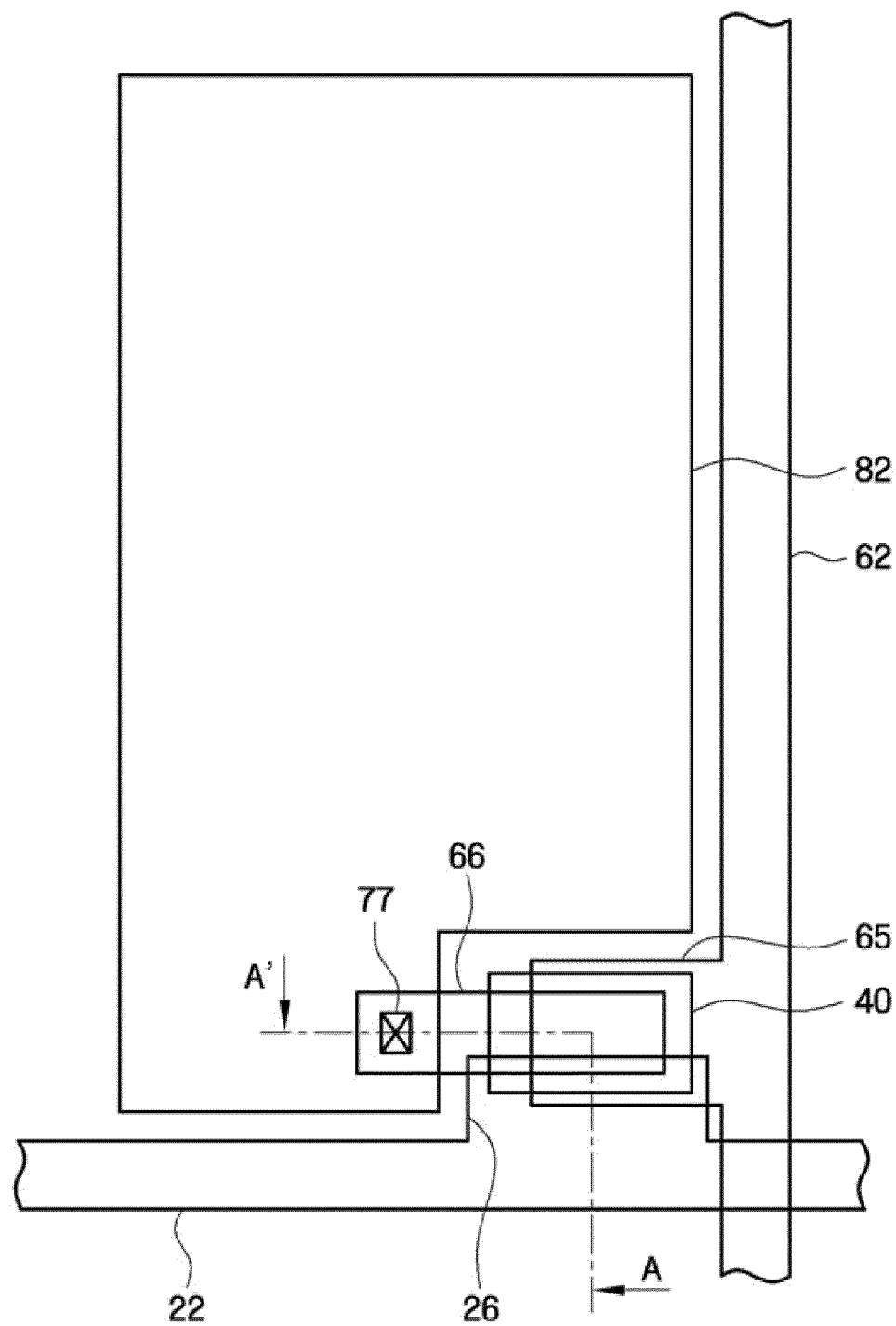
FIG. 1 is a layout diagram of a thin-film transistor (TFT) substrate according to a first embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," "top," "bottom," and the like, may be used herein for ease of description to describe the relationship of one element or feature to another element(s) or feature (s) as illustrated in the figures. It will be understood that the spatially relative terms are intended to encompass different orientations of the device in use or operation, in addition to the orientation depicted in the figures.

Embodiments of the invention are described herein with reference to plan and cross-section illustrations that are schematic illustrations of idealized embodiments (and intermediate structures) of the invention. Variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Hereinafter, a thin-film transistor (TFT) substrate according to embodiments of the present invention will be described in detail with reference to the attached drawings. A liquid crystal display (LCD) including the TFT substrate may further include an upper substrate which faces the TFT substrate and a liquid crystal layer which consists of liquid crystal molecules and is interposed between the two substrates.

Figure 2:
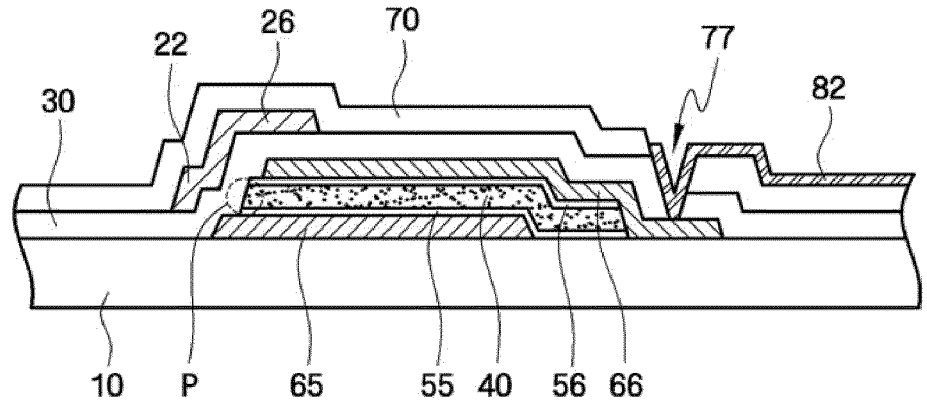
FIG. 2 is a cross-sectional view of the TFT substrate taken along the line A-A' of FIG. 1.

First of all, the structure of a TFT substrate according to a first embodiment of the present invention will be described with reference to FIGS. 1 and 2. FIG. 1 is a layout diagram of the TFT substrate according to the first embodiment of the present invention. FIG. 2 is a cross-sectional view of the TFT substrate taken along the line A-A' of FIG. 1.

Referring to FIGS. 1 and 2, a data line 62 is formed on an insulating substrate 10 to extend in a vertical direction. A source electrode 65 of a TFT is also formed on the insulating substrate 10 and protrudes from the data line 62. The data line 62 and the source electrode 65 may have a mono-layer structure or a multi-layer structure composed of metal with low resistivity, such as aluminum, an aluminum alloy, copper, and a copper alloy.

A first ohmic contact layer 55, a semiconductor pattern 40, and a second ohmic contact layer 56 are sequentially positioned on the source electrode 65. The first and second ohmic contact layers 55 and 56 may be made of silicide or n+hydrogenated amorphous silicon doped with n-type impurities in high concentration. The semiconductor pattern 40 may be made of a semiconductor material such as hydrogenated amorphous silicon or polycrystalline silicon. The first ohmic contact layer 55, the semiconductor pattern 40, and the second ohmic contact layer 56 may have substantially the same plane pattern shape.

A drain electrode 66 is formed on the second ohmic contact layer 56 to overlap the source electrode 65. The drain electrode 66 may have a mono-layer structure or a multi-layer structure composed of metal with low resistivity, such as aluminum, an aluminum alloy, copper, or a copper alloy. The first ohmic contact layer 55 reduces contact resistance between the source electrode 65 thereunder and the semiconductor pattern 40 thereon, and the second ohmic contact layer 56 reduces contact resistance between the semiconductor pattern 40 thereunder and the drain electrode 66 thereon.

A gate insulating film 30, which is made of silicon nitride (SiNx), is disposed on the drain electrode 66.

A gate line 22 and a gate electrode 26 of the TFT are formed on the gate insulating film 30. The gate line 22 extends in a horizontal direction, and the gate electrode 26 protrudes from the gate line 22. The gate line 22 and the data line 62 intersect each other to define a pixel. The gate electrode 26 is disposed on the gate insulating film 30 to overlap a side of the semiconductor pattern 40, thereby forming the TFT with a short channel region P. Specifically, the drain electrode 66 and the source electrode 65 are formed above and under the semiconductor pattern 40, respectively, and the gate electrode 26 is formed on a side of the semiconductor pattern 40 with the gate insulating film 30 interposed therebetween.

A portion of the semiconductor pattern 40, which is adjacent to the gate electrode 26, forms the channel region P. A width of the channel region P is proportional to the area of a portion of the source electrode 65 overlapped by the drain electrode 66. In addition, a length of the channel region P is determined by a thickness of the semiconductor pattern 40. Therefore, despite limitations of exposure facilities, the length of the semiconductor pattern 40 can be significantly reduced since the thickness of the semiconductor pattern 40 can be controlled independently of the exposure facilities.

A passivation layer 70 is formed on the gate line 22, the gate electrode 26, and the gate insulating film 30. The passivation layer 70 may be made of an inorganic material such as silicon nitride or silicon oxide, an organic material having photosensitivity and superior planarization characteristics, or a low-k dielectric material formed by plasma enhanced chemical vapor deposition (PECVD), such as a-Si:C:O or a-Si:O:F. The passivation layer 70 may be composed of a lower inorganic layer and an upper organic layer. When necessary, the passivation layer 70 may be omitted.

A contact hole 77 is formed in the passivation layer 70 and the gate insulating film 30 to extend to a portion of the drain electrode 66.

A pixel electrode 82 is formed on the passivation layer 70 to substantially match the shape of a pixel. The pixel electrode 82 is electrically connected to the drain electrode 66 by the contact hole 77. The pixel electrode 82 may be made of transparent conductors, such as indium tin oxide (ITO) or indium zinc oxide (IZO), or reflective conductors such as aluminum. In the present embodiment, the pixel electrode 82 that substantially matches the shape of the pixel is rectangular. However, the present invention is not limited thereto, as the pixel electrode 82 may have various shapes and does not need to match the shape of the pixel. For example, the pixel electrode 82 may be slit-shaped or branch-shaped. The pixel electrode 82 may also be divided into two or more subpixel electrodes.

Hereinafter, a method of manufacturing the TFT substrate according to the first embodiment of the present invention will be described in detail with reference to FIGS. 1 and 2.

Referring to FIGS. 1 and 2, a first conductive film is positioned on the insulating substrate 10 and then patterned to form the data line 62 and the source electrode 65. The first conductive film may be deposited by, for example, sputtering. In addition, the data line 62 and the source electrode 65 may be patterned by wet etching or dry etching. For wet etching, phosphoric acid, nitric acid, or acetic acid may be used as an etchant. For dry etching, a chlorine (Cl)-based etch gas, such as $Cl_2$ or $BCl_3$, may be used.

Next, a first amorphous silicon layer doped with impurities, a second amorphous silicon layer undoped with impurities, and a third amorphous silicon layer doped with impurities are sequentially deposited on the data line 62 and the source electrode 65 by, for example, chemical vapor deposition (CVD). The three layers are patterned to form the first ohmic contact layer 55, the semiconductor pattern 40, and the second ohmic contact layer 56 positioned sequentially.

A second conductive film is positioned on the second ohmic contact layer 56 by, e.g., sputtering and then patterned to form the drain electrode 66. Here, the drain electrode 66 is formed to overlap the semiconductor pattern 40 and the source electrode 65.

Then, the gate insulating film 30 is formed on the drain electrode 66, and the gate line 22 and the gate electrode 26 are formed on the gate insulating film 30. Here, the gate electrode 26 is formed to overlap a side of the semiconductor pattern 40.

The passivation layer 70 is formed on the gate line 22, the gate electrode 26, and the gate insulating film 30. The passivation layer 70 and the gate insulating film 30 which overlap a portion of the drain electrode 66 are etched to form the contact hole 77 which extends to the portion of the drain electrode 66.

The pixel electrode 82 is formed on the passivation layer 70 and connected to the drain electrode 66 by the contact hole 77.

In the present embodiment, the passivation layer 70 may be optionally omitted. When the passivation layer 70 is omitted, the contact hole 77 may be formed while the gate insulating film 30 is formed. Then, the gate line 22, the gate electrode 26, and the pixel electrode 82 may be formed on the gate insulating film 30. In this case, the pixel electrode 82 may be made of the same material as the gate line 22 and the gate electrode 26.

Figure 3:
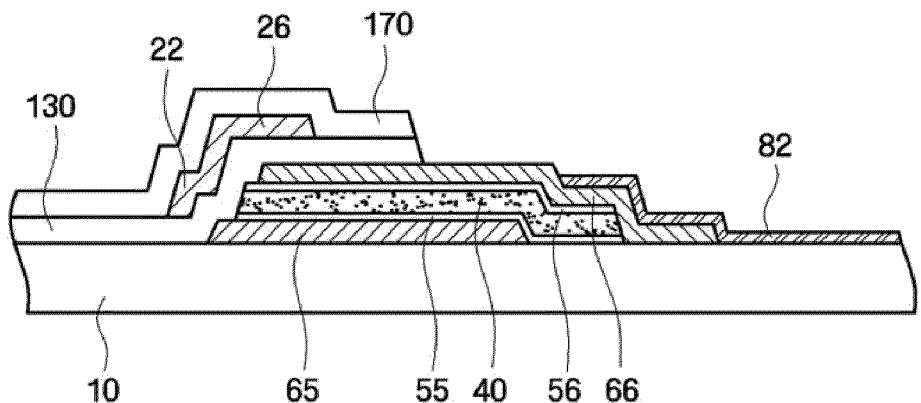
FIG. 3 is a cross-sectional view of a TFT substrate according to a second embodiment of the present invention.

Hereinafter, the structure of a TFT substrate according to a second embodiment of the present invention will be described with reference to FIG. 3. FIG. 3 is a cross-sectional view of the TFT substrate according to the second embodiment of the present invention. That is, FIG. 3 is a modified example of FIG. 2. For simplicity, elements substantially identical to those illustrated in the drawings for the first embodiment are indicated by like reference numerals, and thus their description will be omitted. Therefore, differences between the first and second embodiments will mainly be described.

Referring to FIG. 3, no contact hole is formed in a gate insulating film 130 and a passivation layer 170 which overlap a portion of a drain electrode 66. Instead, a portion of the gate insulating film 130 and a portion of the passivation layer 170 which overlap an end of the drain electrode 66 may be removed. Furthermore, a portion of the gate insulating film 130 and a portion of the passivation layer 170 in a pixel region may be removed. In this case, a pixel electrode 82 may contact an insulating substrate 10.

In the present embodiment, the passivation layer 170 may be optionally omitted. When the passivation layer 170 is omitted, the gate insulating film 130 may be patterned to remove a portion or portions of the gate insulating film 130 which overlap an end of the drain electrode 66 while the gate insulating film 130 is formed. Then, a gate line 22, a gate electrode 26, and the pixel electrode 82 may be formed on the gate insulating film 130, the drain electrode 66, and the insulating substrate 10. In this case, the pixel electrode 82 may be made of the same material as the gate line 22 and the gate electrode 26.

Figure 4:
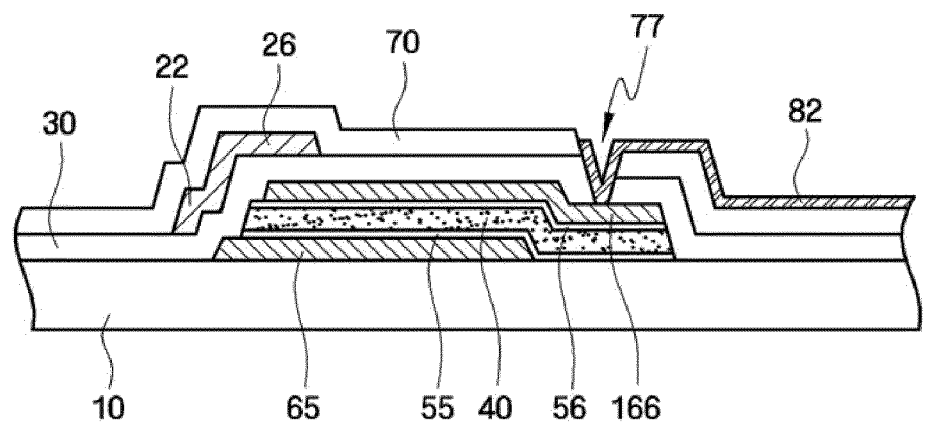
FIG. 4 is a cross-sectional view of a TFT substrate according to a third embodiment of the present invention.

Hereinafter, the structure of a TFT substrate according to a third embodiment of the present invention will be described with reference to FIG. 4. FIG. 4 is a cross-sectional view of the TFT substrate according to the third embodiment of the present invention. That is, FIG. 4 is a modified example of FIG. 2. For simplicity, elements substantially identical to those illustrated in the drawings for the first embodiment are indicated by like reference numerals, and thus their description will be omitted. Therefore, differences between the first and third embodiments will mainly be described.

Referring to FIG. 4, a first ohmic contact layer 55, a semiconductor pattern 40, a second ohmic contact layer 56, and a drain electrode 166 may be formed by a single mask process. Therefore, the first ohmic contact layer 55, the semiconductor pattern 40, the second ohmic contact layer 56, and the drain electrode 166 may have substantially the same plane pattern.

In the present embodiment, a passivation layer 70 may be optionally omitted. When the passivation layer 70 is omitted, a contact hole 77 may be formed while a gate insulating film 30 is formed. Then, a gate line 22, a gate electrode 26, and a pixel electrode 82 may be formed on the gate insulating film 30. In this case, the pixel electrode 82 may be made of the same material as the gate line 22 and the gate electrode 26.

Figure 5:
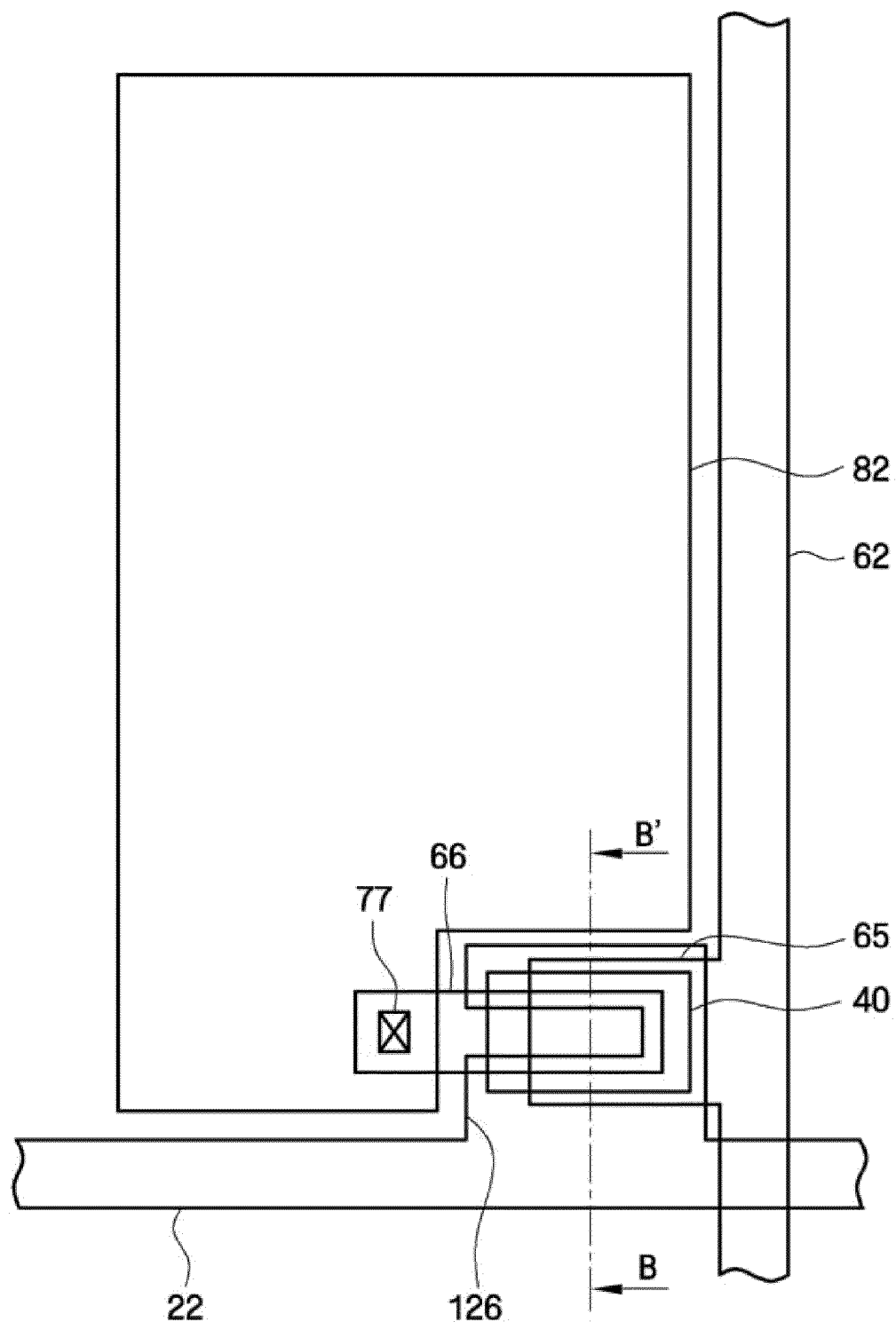
FIG. 5 is a layout diagram of a TFT substrate according to a fourth embodiment of the present invention.
Figure 6:
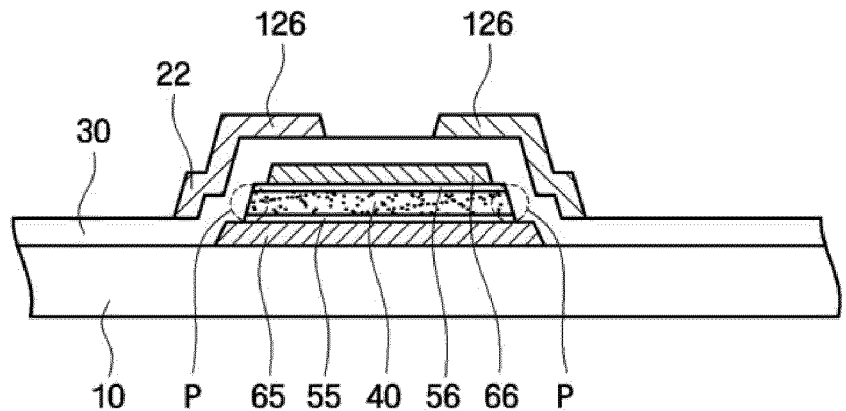
FIG. 6 is a cross-sectional view of the TFT substrate taken along the line B-B' of FIG. 5.

Hereinafter, the structure of a TFT substrate according to a fourth embodiment of the present invention will be described with reference to FIGS. 5 and 6. FIG. 5 is a layout diagram of the TFT substrate according to the fourth embodiment of the present invention. FIG. 6 is a cross-sectional view of the TFT substrate taken along the line B-B' of FIG. 5. For simplicity, elements substantially identical to those illustrated in the drawings for the first embodiment are indicated by like reference numerals, and thus their description will be omitted. Therefore, differences between the first and fourth embodiments will mainly be described.

Referring to FIGS. 5 and 6, a gate line 22 is formed on a gate insulating film 30 to extend in a horizontal direction, and a gate electrode 126 protrudes in a "U" shape from the gate line 22. The gate electrode 126 overlaps two or more sides of a semiconductor pattern 40, and thus a channel region P of a TFT is formed on two or more sides of the semiconductor pattern 40. Accordingly, a width of the channel region P can be increased. In the present embodiment, a passivation layer is not formed on the gate line 22 and the gate electrode 126.

Figure 7:
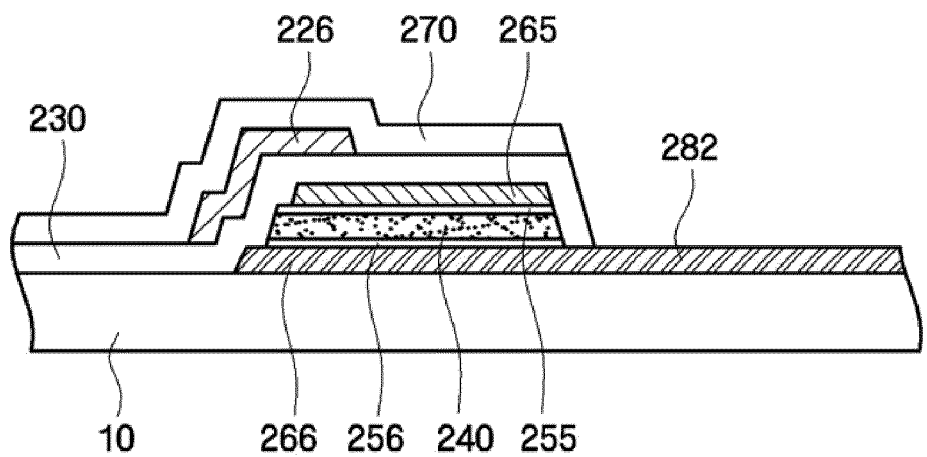
FIG. 7 is a cross-sectional view of a TFT substrate according to a fifth embodiment of the present invention.

Hereinafter, the structure of a TFT substrate according to a fifth embodiment of the present invention will be described with reference to FIG. 7. FIG. 7 is a cross-sectional view of the TFT substrate according to the fifth embodiment of the present invention. That is, FIG. 7 is a modified example of FIG. 2.

Referring to FIG. 7, a pixel electrode 282 is formed after the shape of a pixel on an insulating substrate 10. A drain electrode 266 protrudes from the pixel electrode 282 and is disposed in a TFT region. The drain electrode 266 and the pixel electrode 282 may be formed in the same plane and of identical or different materials. In the present embodiment, the drain electrode 266 is made of the same material as the pixel electrode 282. The drain electrode 266 and the pixel electrode 282 may be made of transparent conductors, such as ITO or IZO, or reflective conductors such as aluminum.

A first ohmic contact layer 256, a semiconductor pattern 240, and a second ohmic contact layer 255 are sequentially positioned on the drain electrode 266. The first and second ohmic contact layers 256 and 255 may be made of silicide or n+hydrogenated amorphous silicon doped with n-type impurities in high concentration. The semiconductor pattern 240 may be made of a semiconductor material such as hydrogenated amorphous silicon or polycrystalline silicon. The first ohmic contact layer 256, the semiconductor pattern 240, and the second ohmic contact layer 255 may have substantially the same plane pattern shape.

A data line (not shown) is formed on the second ohmic contact layer 255 and extends in a vertical direction. A source electrode 265 protrudes from the data line. The data line and the source electrode 265 are separated from the drain electrode 266 with the semiconductor pattern 240 interposed therebetween. The data line and the source electrode 265 may have a mono-layer structure or a multi-layer structure composed of metal with low resistivity, such as aluminum, an aluminum alloy, copper, or a copper alloy.

A gate insulating film 230 made of silicon nitride is disposed on the data line, the source electrode 265, the pixel electrode 282 and the insulating substrate 10 and then patterned such that a portion or portions of the gate insulating film 230 which overlap the pixel electrode 282 are removed.

A gate line and a gate electrode 226 of a TFT are formed on the gate insulating film 230. The gate line extends in a horizontal direction, and the gate electrode 226 protrudes from the gate line. The gate line and the data line intersect each other to define a pixel. The gate electrode 226 is disposed on the gate insulating film 230 to overlap a side of the semiconductor pattern 240, thereby forming the TFT with a short channel region. Specifically, the source electrode 265 and the drain electrode 266 are formed above and under the semiconductor pattern 240, respectively, and the gate electrode 226 is formed on a side of the semiconductor pattern 240 with the gate insulating film 230 interposed therebetween.

A portion of the semiconductor pattern 240, which is adjacent to the gate electrode 226, forms the channel region. A width of the channel region is proportional to the area of a portion of the drain electrode 266 overlapped by the source electrode 265. In addition, a length of the channel region is determined by a thickness of the semiconductor pattern 240. Therefore, despite limitations of exposure facilities, the length of the semiconductor pattern 240 can be significantly reduced since the thickness of the semiconductor pattern 240 can be controlled independently of the exposure facilities.

A passivation layer 270 is formed on the gate line, the gate electrode 226, and the gate insulating film 230. Then, the passivation layer 270 is patterned such that a portion or portions of the passivation layer 270 which overlap the pixel electrode 282 in a pixel region are removed. The passivation layer 270 may be made of an inorganic material such as silicon nitride or silicon oxide, an organic material having photosensitivity and superior planarization characteristics, or a low-k dielectric material formed by PECVD, such as a-Si:C:O or a-Si:O:F. The passivation layer 270 may be composed of a lower inorganic layer and an upper organic layer. When necessary, the passivation layer 270 may be omitted.

Figure 8:
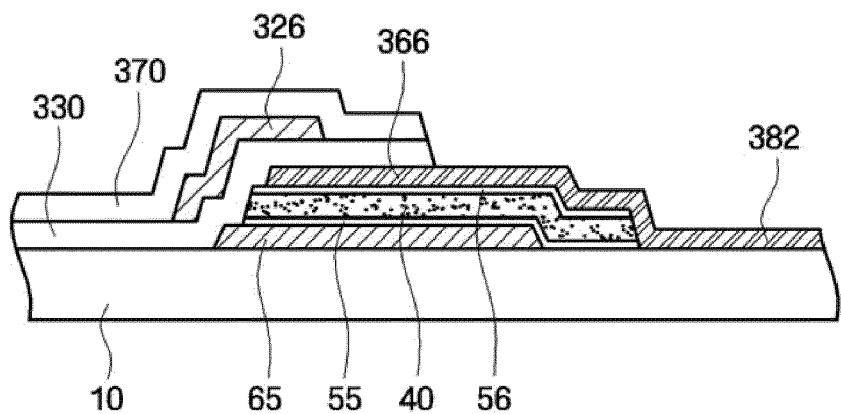
FIG. 8 is a cross-sectional view of a TFT substrate according to a sixth embodiment of the present invention.

Hereinafter, the structure of a TFT substrate according to a sixth embodiment of the present invention will be described with reference to FIG. 8. FIG. 8 is a cross-sectional view of the TFT substrate according to the sixth embodiment of the present invention. That is, FIG. 8 is a modified example of FIG. 2. For simplicity, elements substantially identical to those illustrated in the drawings for the first embodiment are indicated by like reference numerals, and thus their description will be omitted. Therefore, differences between the first and fourth embodiments will mainly be described.

Referring to FIG. 8, a data line and a source electrode 65 are formed on an insulating substrate 10, and a first ohmic contact layer 55, a semiconductor pattern 40, and a second ohmic contact layer 56 are sequentially positioned on the source electrode 65.

A drain electrode 366 is formed on the second ohmic contact layer 56, and a pixel electrode 382 is connected to the drain electrode and disposed in a pixel region. The drain electrode 366 may be formed continuously with and of the same material as the pixel electrode 382. The drain electrode 366 and the pixel electrode 382 may be formed by a single mask process. The drain electrode 366 and the pixel electrode 382 are separated from the source electrode 65 and the data line with the semiconductor pattern 40 interposed therebetween. The drain electrode 366 and the pixel electrode 382 may be made of transparent conductors, such as ITO or IZO, or reflective conductors such as aluminum.

A gate insulating film 330 made of silicon nitride is disposed on the drain electrode 366 and the pixel electrode 382 and then patterned such that a portion or portions of the gate insulating film 330 which overlap the pixel electrode 382 are removed.

A gate line and a gate electrode 326 of a TFT are formed on the gate insulating film 330. The gate line extends in a horizontal direction, and the gate electrode 326 protrudes from the gate line. The gate line and the data line intersect each other to define a pixel. The gate electrode 326 is disposed on the gate insulating film 330 to overlap a side of the semiconductor pattern 40, thereby forming the TFT with a short channel region.

A passivation layer 370 is formed on the gate line, the gate electrode 326, and the gate insulating film 330. Then, the passivation layer 370 is patterned such that a portion or portions of the passivation layer 370 which overlap the pixel electrode 382 in the pixel region are removed. The passivation layer 370 may be made of an inorganic material such as silicon nitride or silicon oxide, an organic material having photosensitivity and superior planarization characteristics, or a low-k dielectric material formed by PECVD, such as a-Si:C:O or a-Si:O:F. The passivation layer 370 may be composed of a lower inorganic layer and an upper organic layer. When necessary, the passivation layer 370 may be omitted.

Figure 9:
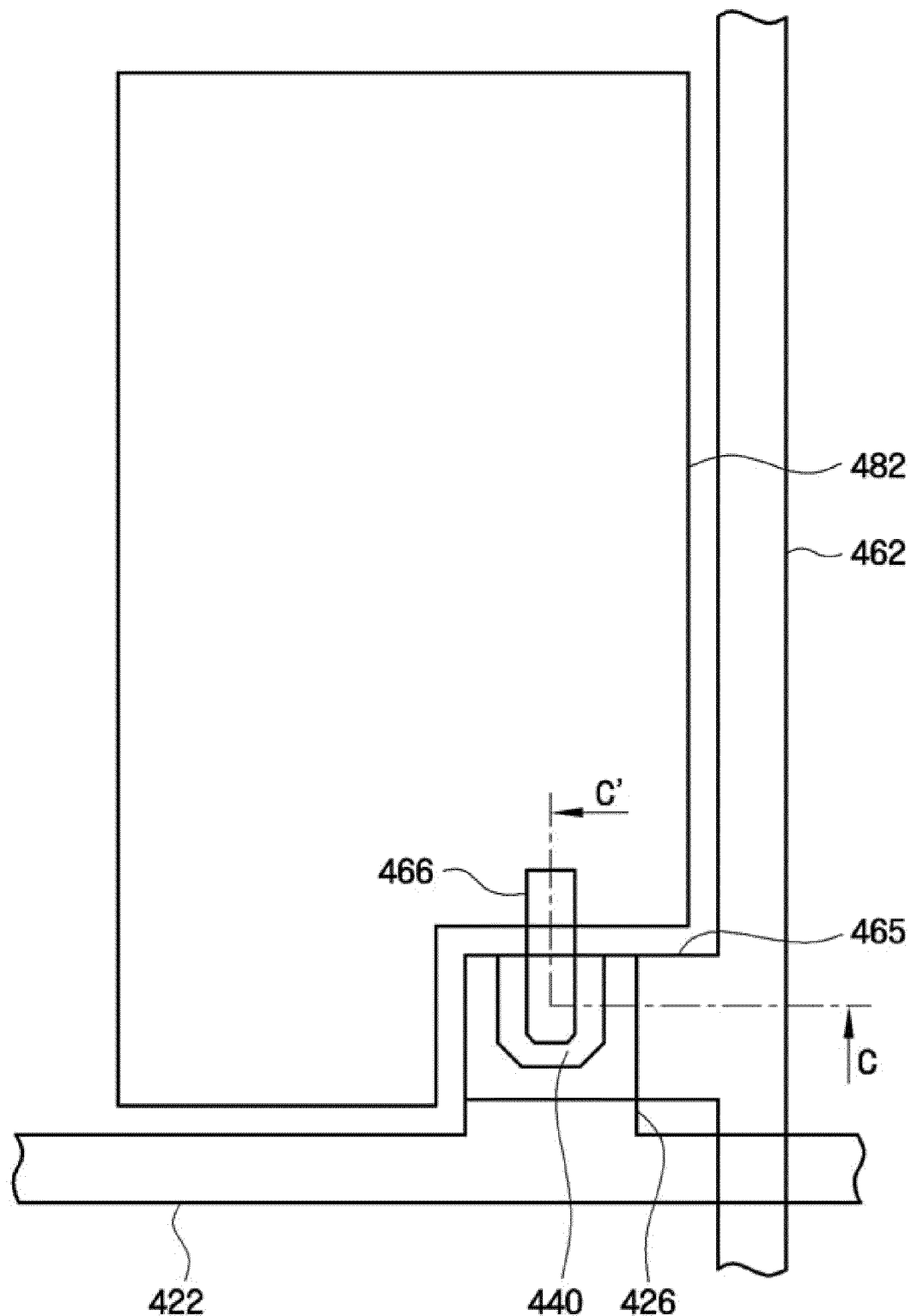
FIG. 9 is a layout diagram of a TFT substrate according to a seventh embodiment of the present invention.
Figure 10:
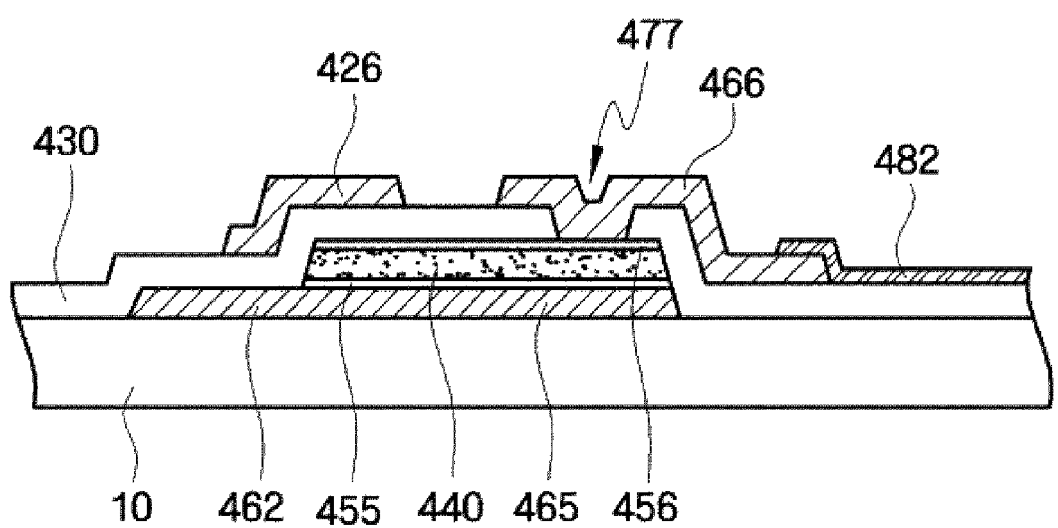
FIG. 10 is a cross-sectional view of the TFT substrate taken along the line C-C' of FIG. 9.

Hereinafter, the structure of a TFT substrate according to a seventh embodiment of the present invention will be described with reference to FIGS. 9 and 10. FIG. 9 is a layout diagram of the TFT substrate according to the seventh embodiment of the present invention. FIG. 10 is a cross-sectional view of the TFT substrate taken along the line C-C' of FIG. 9.

Referring to FIGS. 9 and 10, a data line 462 is formed on an insulating substrate 10 to extend in a vertical direction. A source electrode 465 of a TFT is also formed on the insulating substrate 10 and protrudes from the data line 462. The data line 462 and the source electrode 465 may have a mono-layer structure or a multi-layer structure composed of metal with low resistivity, such as aluminum, an aluminum alloy, copper, or a copper alloy.

A first ohmic contact layer 455, a semiconductor pattern 440, and a second ohmic contact layer 456 are sequentially positioned on the source electrode 465. The first and second ohmic contact layers 455 and 456 may be made of silicide or n+hydrogenated amorphous silicon doped with n-type impurities in high concentration. The semiconductor pattern 440 may be made of a semiconductor material such as hydrogenated amorphous silicon or polycrystalline silicon. The first ohmic contact layer 455, the semiconductor pattern 440, and the second ohmic contact layer 456 may have substantially the same plane pattern shape.

The data line 462, the source electrode 465, the first ohmic contact layer 455, the semiconductor pattern 440, and the second ohmic contact layer 456 may be formed by a single mask process. Here, since the data line 462 and the source electrode 465 have a substantially different plane pattern shape from the first ohmic contact layer 455, the semiconductor pattern 440, and the second ohmic contact layer 456, they may be formed by a single mask process using a slit mask or a semi-transmissive mask.

Specifically, a first conductive film is formed on the insulating substrate 10. Then, a first amorphous silicon layer doped with impurities, a second amorphous silicon layer undoped with impurities, and a third amorphous silicon layer doped with impurities are sequentially deposited on the first conductive film. The resultant structure is coated with a photosensitive film, and the photosensitive film is patterned using a slit mask or a semi-transmissive mask to form a photosensitive film pattern. The photosensitive film pattern includes a first region in which the photosensitive film is completely removed, a second region having a first thickness, and a third region having a second thickness which is greater than the first thickness. The first through third amorphous silicon layers and the first conductive film under the first region are patterned using the photosensitive film pattern as an etch mask. The patterned first conductive film is referred to as the data line 462 and the source electrode 465.

Next, a whole surface of the photosensitive film pattern is etched, or the photosensitive film pattern is etched back. As a result, the second region of the photosensitive film pattern is removed. The first through third amorphous silicon layers are etched using the remaining third region of the photosensitive film pattern as an etch mask to form the first ohmic contact layer 455, the semiconductor pattern 440, and the second ohmic contact layer 456.

A gate insulating film 430, which is made of silicon nitride, is disposed on the second ohmic contact layer 456. A contact hole 477 is formed in the gate insulating film 430 to extend to a portion of the second ohmic contact layer 456.

A gate line 422 and a gate electrode 426 of a TFT are formed on the gate insulating film 430. The gate line 422 extends in a horizontal direction, and the gate electrode 426 protrudes from the gate line 422. The gate line 422 and the data line 462 intersect each other to define a pixel. The gate electrode 426 is disposed on the gate insulating film 430 to overlap a side of the semiconductor pattern 440, thereby forming the TFT with a short channel region.

A drain electrode 466 is also formed on the gate insulating film 430 and is connected to the second ohmic contact layer 456 by the contact hole 477. The gate line 422, the gate electrode 426, and the drain electrode 466 may be formed by a single mask process. The gate line 422, the gate electrode 426, and the drain electrode 466 may be formed in substantially the same plane and of substantially the same material. For example, the gate line 422, the gate electrode 426, and the drain electrode 466 may have a mono-layer structure or a multi-layer structure composed of metal with low resistivity, such as aluminum, an aluminum alloy, copper, or a copper alloy.

A pixel electrode 482 is formed after the shape of a pixel and disposed on the drain electrode 466 and the gate insulating film 430. The pixel electrode 482 is electrically connected to the drain electrode 466. The pixel electrode 482 may be made of a transparent conductor, such as ITO or IZO, or a reflective conductor such as aluminum. In the present embodiment, the pixel electrode 482 formed after the shape of the pixel is square. However, the present invention is not limited thereto, and the pixel electrode 482 may have various shapes. For example, the pixel electrode 482 may be patterned to be slit-shaped or branch-shaped. The pixel electrode 482 may also be divided into two or more subpixel electrodes.

While the present disclosure of invention has been particularly shown and described with reference to exemplary embodiments thereof, it will be understood by those of ordinary skill in the art and in light of the foregoing that various changes in form and detail may be made therein without departing from the spirit and scope of the present teachings. The exemplary embodiments should be considered in a descriptive sense only and not for purposes of limitation.

What is claimed is:

1. A thin-film transistor (TFT) substrate comprising:
    an insulating substrate;
    a semiconductor pattern formed on the insulating substrate, the semiconductor pattern having a top surface and a bottom surface, the bottom surface facing the insulating substrate;
    a source electrode disposed on one of the top and bottom surfaces of the semiconductor pattern, and
    a drain electrode disposed on the other one of the top and bottom surfaces of the semiconductor pattern;
    a gate electrode disposed alongside the semiconductor pattern, the gate electrode overlapping the top surface of the semiconductor pattern;
    a data line which is connected to the source electrode and extends in a first direction;
    a gate line which is connected to the gate electrode and extends in a second direction; and
    a pixel electrode which is connected to the drain electrode and is formed in a pixel region.

2. The TFT substrate of claim 1, wherein the gate electrode overlaps a side of the semiconductor pattern.

3. The TFT substrate of claim 1, wherein the data line and the source electrode are formed on the insulating substrate, and the semiconductor pattern and the drain electrode are sequentially positioned on the source electrode.

4. The TFT substrate of claim 3, wherein the gate insulating film is formed on the drain electrode and comprises a contact hole which extends to a portion of the drain electrode, and the pixel electrode is formed on the gate insulating film and connected to the drain electrode by the contact hole.

5. The TFT substrate of claim 3, wherein the gate insulating film is formed on the drain electrode;
    a portion of the gate insulating film which overlaps an end of the drain electrode is removed; and
    a portion of the gate insulating film which overlaps the pixel region is removed such that the pixel electrode contacts the insulating substrate.

6. The TFT substrate of claim 3, wherein the semiconductor pattern and the drain electrode have the same plane pattern.

7. The TFT substrate of claim 3, wherein the gate electrode overlaps two or more sides of the semiconductor pattern.

8. The TFT substrate of claim 7, wherein the gate electrode protrudes in a U shape from the gate line.

9. The TFT substrate of claim 1, wherein the drain electrode and the pixel electrode are formed on the insulating substrate, and the semiconductor pattern and the source electrode are sequentially positioned on the drain electrode.

10. The TFT substrate of claim 9, wherein the drain electrode and the pixel electrode are formed continuously and of the same material.

11. The TFT substrate of claim 10, wherein the drain electrode and the pixel electrode are made of indium tin oxide (ITO) or indium zinc oxide (IZO).

12. The TFT substrate of claim 1, wherein the data line and the source electrode are formed on the insulating substrate, the semiconductor pattern and the drain electrode are sequentially positioned on the source electrode, and the drain electrode and the pixel electrode are formed in the same plane and of the same material.

13. The TFT substrate of claim 12, wherein the drain electrode and the pixel electrode are made of ITO or IZO.

14. The TFT substrate of claim 1, wherein the data line and the source electrode are formed on the insulating substrate, the semiconductor pattern is formed on the source electrode, and the gate insulating film is formed on the semiconductor pattern and comprises a contact hole formed in a portion thereof which overlaps the semiconductor pattern.

15. The TFT substrate of claim 14, wherein the drain electrode is formed on the gate insulating film and is connected to the semiconductor pattern through the contact hole.

16. The TFT substrate of claim 15, wherein the gate electrode and the drain electrode are formed continuously and of the same material.

17. A method of manufacturing a TFT substrate, the method comprising:
   forming a semiconductor pattern on an insulating substrate;
   forming a source electrode on one of top and bottom surfaces of the semiconductor pattern, and
   forming a drain electrode on the other one of the top and bottom surfaces of the semiconductor pattern; and
   forming a gate electrode alongside the semiconductor pattern and overlapping the top surface of the semiconductor pattern,
   wherein a data line is connected to the source electrode and extends in a first direction, a gate line is connected to the gate electrode and extends in a second direction, and a pixel electrode is connected to the drain electrode and is formed in a pixel region, and
   wherein the bottom surface of the semiconductor pattern faces the insulating substrate.

18. The method of claim 17, wherein the gate electrode overlaps a side of the semiconductor pattern.

19. The method of claim 17, wherein the source electrode, the semiconductor pattern, and the drain electrode are sequentially positioned on the insulating substrate.

20. The method of claim 19, wherein the semiconductor pattern and the drain electrode are formed by a single mask process.

21. The method of claim 17, wherein the drain electrode and the pixel electrode are formed on the insulating substrate, and the semiconductor pattern and the source electrode are sequentially positioned on the drain electrode.

22. The method of claim 21, wherein the drain electrode and the pixel electrode are formed continuously and of the same material.

23. The method of claim 17, wherein the data line and the source electrode are formed on the insulating substrate, the semiconductor pattern and the drain electrode are sequentially positioned on the source electrode, and the drain electrode and the pixel electrode are formed continuously and of the same material.

24. The method of claim 17, wherein the data line and the source electrode are formed on the insulating substrate, the semiconductor pattern is formed on the source electrode, and the gate insulating film is formed on the semiconductor pattern and comprises a contact hole formed in a portion thereof which overlaps the semiconductor pattern.

25. The method of claim 24, wherein the drain electrode is formed on the gate insulating film and is connected to the semiconductor pattern by the contact hole.

26. The method of claim 25, wherein the gate electrode and the drain electrode are formed continuously and of the same material.

* * * * *